(12) United States Patent
Friedenauer et al.

(10) Patent No.: US 8,724,205 B2
(45) Date of Patent: May 13, 2014

(54) LASER SYSTEM TO GENERATE A LASER GUIDE STAR

(75) Inventors: Axel Friedenauer, Munich (DE); Wilhelm Kaenders, Munich (DE)

(73) Assignee: TOPTICA Photonics AG, Graefelfing (DE)

( * ) Notice: Subject to any disclaimer, the term of this patent is extended or adjusted under 35 U.S.C. 154(b) by 0 days.

(21) Appl. No.: 13/372,801

(22) Filed: Feb. 14, 2012

(65) Prior Publication Data

US 2012/0224243 A1    Sep. 6, 2012

(30) Foreign Application Priority Data

Feb. 15, 2011  (DE) .......................... 10 2011 011 290

(51) Int. Cl.
*G02B 26/00* (2006.01)
(52) U.S. Cl.
USPC ........................................ 359/238; 359/239
(58) Field of Classification Search
USPC ................... 359/238, 239, 278, 279; 372/50
See application file for complete search history.

(56) References Cited

U.S. PATENT DOCUMENTS

| | | | |
|---|---|---|---|
| 5,796,761 | A | 8/1998 | Injeyan et al. |
| 6,278,100 | B1 | 8/2001 | Friedman et al. |
| 7,035,297 | B1 | 4/2006 | Denman et al. |
| 7,386,017 | B2 | 6/2008 | Payne et al. |
| 2004/0114643 | A1* | 6/2004 | Payne et al. ........................ 372/6 |
| 2004/0246566 | A1* | 12/2004 | Miyamoto et al. ............ 359/334 |

FOREIGN PATENT DOCUMENTS

EP    2 081 264    7/2009

OTHER PUBLICATIONS

Luke R. Taylor et al., "50 W CW visible laser source at 589nm obtained via frequency doubling of three coherently combined narrow-band Raman fibre amplifiers," Optics Express, vol. 18, No. 8, 8540. Spec., p. 4.
L Taylor, Y Feng, D Bonaccini, "High power narrowband 589nm frequency doubled fibre laser source", 14687-14693, Aug. 4, 2009, Optics Express.
T Nishikawa, A Ozawa, Y Nishida, M Asobe, FL Hong, T W Hansch,"Efficient 494 mW sum-frequency generation of sodium resonance radiation at 589nm by using a periodically poled Zn: LiNbO3 ridge waveguide", 17792-17800, Sep. 18, 2009, Optics Express.
G Stern, B Allard, M Robert de Saint Vincent, JP Brantut, B Battelier, T Bourdel, P Bouyer,"frequency doubled 1534nm laser system for potassium laser cooling", 3092-3095, May 28, 2010, Applied Optic vol. 48 No. 16.
Leinhart, et al.,"Compact and robust laser system for rubidium laser cooling based on frequency doubling of a fiber bench at 1560nm", 177-180, Sep. 13, 2007, Applied Physics B 89.

(Continued)

*Primary Examiner* — Scott J Sugarman
*Assistant Examiner* — Mustak Choudhury
(74) *Attorney, Agent, or Firm* — Collard & Roe, P.C.

(57) ABSTRACT

A laser system includes a laser light source which emits electromagnetic radiation, at least one optical amplifier which amplifies the radiation emitted from the laser light source, and a frequency multiplier which converts the amplified radiation by resonant frequency multiplying and/or summation-frequency generating. The laser system has a modulation facility which causes a modulation of the electromagnetic radiation emitted from the laser light source in such a manner that the spectrum encompasses a carrier frequency and at least one sideband, with the frequency multiplier being resonant at the carrier frequency and at the frequency of the at least one sideband.

10 Claims, 1 Drawing Sheet

(56) References Cited

OTHER PUBLICATIONS

Figure 1:
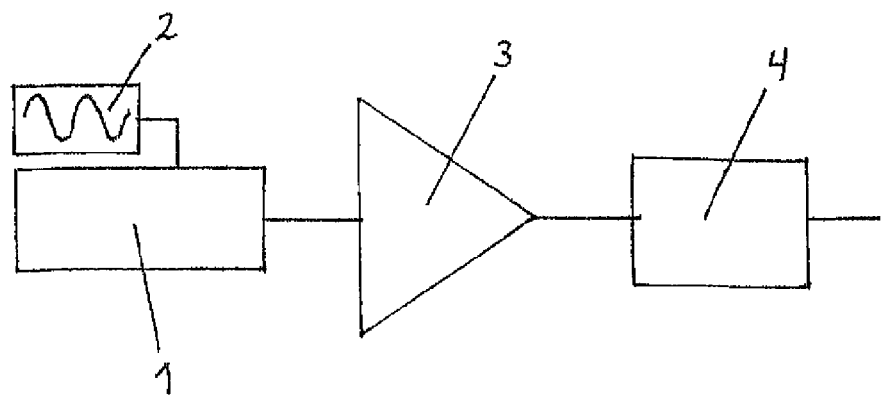

V Menoret, at al., "A transportable cold atom inertial sensor for space applications", International Conference on Space Optics 2010, Rhodes, Greece Oct. 4-8, 2010, Session 14b.

CJ Myatt, NR Newbury, CE Wieman, "Simplified atom trap by using direct microwave modulation of a diode laser", 649-651, Apr. 15, 1993, Optics Letters vol. 18 No. 8.

German Search Report of DE 10 2011 011 290.1 dated Aug. 4, 2011, with English translation of relevant parts.

Edward Kibblewhite, "The Physics of the Sodium Laser Guide Star: Predicting and Enhancing the Photon Returns", AMOS Conference Technical Papers 2009.

J.R. Morris, "Efficient excitation of a mesopheric sodium laser guide star by intermediate-duration pulses", J. Opt. Soc. Am. A, vol. 11, No. 2, Feb. 1994, 832-845.

R. Holzlöhner et al., "Optimization of CW sodium laser guide star efficiency," Astronomy & Astrophysics, 510, A20, 2010. Spec., p. 2.

\* cited by examiner

LASER SYSTEM TO GENERATE A LASER GUIDE STAR

CROSS REFERENCE TO RELATED APPLICATIONS

Applicant claims priority under 35 U.S.C. §119 of German Application No. 10 2011 011 290.1 filed on Feb. 15, 2011, the disclosure of which is incorporated by reference.

The invention relates to a laser system comprised of
a laser light source which emits electromagnetic radiation,
at least one optical amplifier which amplifies the radiation emitted from the laser light source, and
a frequency multiplier which converts the amplified radiation by resonant frequency multiplying and/or summation-frequency generating.

On observing astronomical objects by means of terrestrial optical telescopes, it should be considered that the light of astronomical objects is influenced as it penetrates through the atmosphere due to different temperature layers, air movements, etc. which leads to distorted and blurred images. It is a problem which is relevant for telescopes having mirror diameters of several meters. Therefore, large optical telescopes with 8-10 m large mirrors (e.g. the Keck telescope) apply adaptive optics in order to offset the interferences of the falling-incident light wave front that are caused by the atmosphere. In this manner, the resolution can be increased substantially (from approx. one arc second to 30-60 milli-arc seconds). To control adaptive optics, the image of a reference system is recorded and evaluated. The optics is actively adapted by the aid of a control loop so that the image of the reference star comes as close as possible to the ideal image of a point-shaped object. In the past, mainly natural reference stars were utilized for this purpose. However, the problem is that stars having sufficient brightness only appear in a few sky areas. For this reason, one has come more recently to applying the concept of artificial laser-generated guide stars (Laser Guide Star). Advantage is taken of the fact that light metallic atoms such as sodium, potassium, iron atoms are enriched in certain layers of the atmosphere. For example, sodium atoms are enriched in the mesosphere at an altitude of between 90 and 110 km above the earth surface. For those astronomical purposes being of interest here, this sphere is utilized as projection area for the laser guide stars. An intensive narrow-band or single-frequency laser beam is emitted from the earth into the sky, i.e. at a suitable wavelength in order to excite the sodium atoms in the mesosphere resonantly to fluorescence. A point-shaped artificial star is created in this manner which can be utilized as reference for astronomic telescopes with adaptive optics.

Requirements exacted from suitable laser systems to generate laser guide stars are high. In the ideal case, a high power of 20 W or more is required, i.e. at a line width of a few GHz up to less than 5 MHz with the sodium resonance of 589 nm (sodium-D-line). To achieve sufficient intensity of the laser guide star, it is required to achieve the most intensive possible interaction between the laser and the few sodium atoms in the mesosphere. It should be noted that the electronic excitation scheme of the sodium atom is no pure 2-level system. Of special importance is in particular the hyperfine splitting of the excited fluorescence line. The hyperfine splitting takes the effect that after a few excitation cycles the fluorescence electron is optically pumped into a non-resonant status. Afterwards the electron is no longer available for fluorescence which implies instant loss of the pertinent atom for fluorescence backscattering. This can be counteracted by generating the laser light in a manner that its spectrum comprises two lines, i.e. at the fluorescence frequency and a back-pumping frequency. The fluorescence frequency excites the fluorescence of the corresponding sodium resonance. Versus the fluorescence frequency, the back-pumping frequency is detuned by the amount corresponding to the hyperfine splitting of the relevant sodium line and it takes the effect that the exciting electron is "pumped back" from the non-resonant status and is thus again rendered available for the fluorescence process. In this manner, the intensity of the fluorescence light can be substantially increased by factors (vide R. Holzöhner et al., "Optimization of CW sodium laser guide star efficiency", Astronomy & Astrophysics, 510, A20, 2010).

Up to now, for generating a laser light, a laser system of the species outlined hereinabove has been used, which is comprised of a laser light source, an optical amplifier to amplify the radiation of the laser light source, and a frequency multiplier which by way of frequency doubling generates the desired intensive laser light in a narrow band at the frequency of the sodium resonance. To generate the sideband with the back-pumping frequency according to the hyperfine splitting of the relevant sodium line, an electro-optical modulator (EOM) has hitherto been applied which modulates in high frequency the radiation converted by frequency multiplying, choosing the modulation frequency in accordance with the desired frequency distance between fluorescence frequency and back-pumping frequency. Suitable electro-optical modulators that are operable at the corresponding frequencies and cope with the high intensity of the laser light are sophisticated and thus costly components.

Now, therefore, and against this background, it is the object of the present invention to provide an improved laser system for generating laser guide stars.

This task is solved by the present invention on the basis of a laser system of the species outlined hereinabove in such a manner that the laser system is comprised of a modulation device that causes a modulation of the electromagnetic radiation emitted from the laser light source so that the spectrum is comprised of a carrier frequency and at least one sideband, with the frequency multiplier being resonant with the carrier frequency and the frequency of the at least one sideband.

In accordance with the invention, a modulation of the electromagnetic radiation emitted from the laser light source, i.e. the non-amplified laser radiation, is executed. In this manner, the spectrum of the non-amplified radiation receives components at the carrier frequency and with at least one sideband. The at least one sideband is co-amplified by the optical amplifier which preferably is a Raman fibre amplifier, because the bandwidth of the amplification of the Raman fibre amplifier is larger than the frequency distance of the sideband from the carrier frequency. With the subsequent frequency multiplying, the free spectral range of the frequency multiplier is harmonized to the frequency of the spectral components to be generated for each relevant application. Thus, upon conversion of the radiation, a radiation amplified by means of the frequency multiplier is obtained, the spectrum of which comprises components with the fluorescence frequency and the back-pumping frequency. The carrier frequency corresponds to the desired fluorescence frequency, while the frequency distance of the back-pumping frequency from the fluorescence frequency corresponds to the hyperfine splitting of the atomic line. Thus, for generating a laser guide star, it is thus sufficient if by applying this method of amplification by means of the Raman fibre amplifier and upon frequency multiplying, the power of the radiation obtained lies in the range of 20 W, because an effective increase in intensity of fluorescence occurs on account of the back-pumping frequency contained in the spectrum of the radiation.

On applying the inventive laser system, one can dispense with a downstream electro-optical modulator. Therefore, the laser system has a markedly simpler, more cost-efficient and less maintenance-demanding set-up. It surprisingly becomes evident that the spectral components generated by modulation, e.g. on using a suitably built-up Raman fibre amplifier, pass through the system in a very stable phase position and that a four-wave mixing does not occur. Finally, all amplifiers that fulfill this requirement can be utilized for the efficient generation of radiation with the various spectral components in accordance with the present invention without it being necessary to implement an additional electro-optical modulator or a different modulation technique.

A Raman fibre amplifier suitable for the inventive laser system is disclosed, for example, in EP 2 081 264 A1. In supplementation thereto, reference is made to the publication issued by Luke R. Taylor et al. ("50 W CW visible laser source at 589 nm obtained via frequency doubling of three coherently combined narrow-band Raman fibre amplifiers", Optics Express, Vol. 18, No. 8, 8540).

For generating a laser guide star by fluorescence excitation of sodium atoms in the mesosphere, the fluorescence frequency of the laser radiation should correspond to a wavelength of 589 nm, whereas the frequency distance of the back-pumping frequency from the carrier frequency amounts to +−1.7 GHz. This frequency distance corresponds to the hyperfine splitting of the relevant sodium line.

In accordance with a preferred embodiment of the inventive laser system, the modulation frequency, i.e. the frequency distance of the sideband from the carrier frequency in the spectrum of the radiation emitted from the laser light source, corresponds to the hyperfine splitting of the sodium line. After amplifying the modulated laser light, as has been outlined hereinabove, the free spectral range of the frequency amplifier is exactly tuned to the frequencies of the spectral components to be generated. Frequency multiplying is accomplished via non-linear optical processes. Of relevance are two processes, i.e. frequency doubling and summation-frequency generating. Expediently, the intensity with the fluorescence frequency in the spectrum of the converted radiation is generated by frequency doubling. Accordingly, the intensified radiation with the carrier frequency is frequency-doubled. The radiation with the back-pumping frequency is generated by summation-frequency generating, i.e. based on the intensified radiation with the carrier frequency and with the frequency of the sideband. Thereby, it is possible to obtain a particularly high intensity with the back-pumping frequency, because the intensity with the summation-frequency generating depends on the product of the intensities of the two underlying light fields. Consequently, the radiation with back-pumping frequency can be generated much more efficiently by summation-frequency generating than by frequency doubling. Conversely, the non-desired frequency-doubled sideband radiation component is quadratically attenuated. Thus, the efficient modulation of the electromagnetic radiation of the laser light source is expediently realized with the frequency that corresponds to the hyperfine splitting of the sodium line and not—as one might trivially expect— with half the value of this frequency.

With another preferred embodiment of the present invention, the laser light source of the inventive laser system is a diode laser with at least one laser diode, wherein the modulation device modulates the injection stream of the laser diode in high frequency. Modulation of the injection stream with high frequency represents a widespread method for generating spectral sidebands which are frequently applied in the field of telecommunication and in the field of quantum optics, too. This kind of "electronic" modulation is especially easy to realize. Thus, the inventive laser system can be provided at markedly less costs than prior art laser systems which work with electro-optical modulators.

Reference should be made to the possibility of a serrodyne modulation (e.g. with a serrated or stepped modulation signal) of the electromagnetic radiation of the laser light source, in particular if modulation is realized by high-frequency modulation of the injection stream of the laser diode. Instead of usually two symmetrical sidebands, it is possible in this manner to selectively generate sidebands with different intensities. It is thereby made possible to generate the sideband with the highest possible intensity that is afterwards taking part in the frequency multiplication and/or summation frequency generating to generate the radiation with the back-pumping frequency.

In a preferred embodiment, the inventive laser system is comprised of a stabilizing facility which stabilizes the frequency multiplier in frequency, and wherein the modulation facility causes an additional modulation of the electromagnetic radiation emitted from the laser light source in such a manner that the spectrum comprises at least another sideband for frequency stabilization on the basis of a Pound-Drever-Hall process. Accordingly, the modulation facility of the electromagnetic radiation of the laser light source modulates not only one sideband but two sidebands. One of the sidebands ultimately serves for generating a radiation with the back-pumping frequency, while the other sideband solely serves for stabilizing the frequency multiplier. The frequency multiplier converts the intensified radiation by resonant frequency multiplication and/or summation-frequency generating. To this effect, it is in practice comprised of an optical resonator in which the non-linear crystal for frequency multiplication and/or summation-frequency generating is located. Expediently, at least one mirror of the optical resonator of frequency multiplier is mechanically adjustable so that frequency stabilization can be achieved in this manner. For example, in accordance with the Pound-Drever-Hall process, part of the light circulating in the resonator is uncoupled from it and measured by means of a photodetector. The measuring signal is transmitted to a mixing stage and is subjected to phase detection. The detected phase is then converted into a control signal to stabilize the optical resonator. The modulation frequency for frequency stabilization of the frequency multiplier typically ranges between 5 and 100 MHz. However, it is also feasible to apply other prior art techniques for resonator stabilization in accordance with the present invention.

Figure 2:
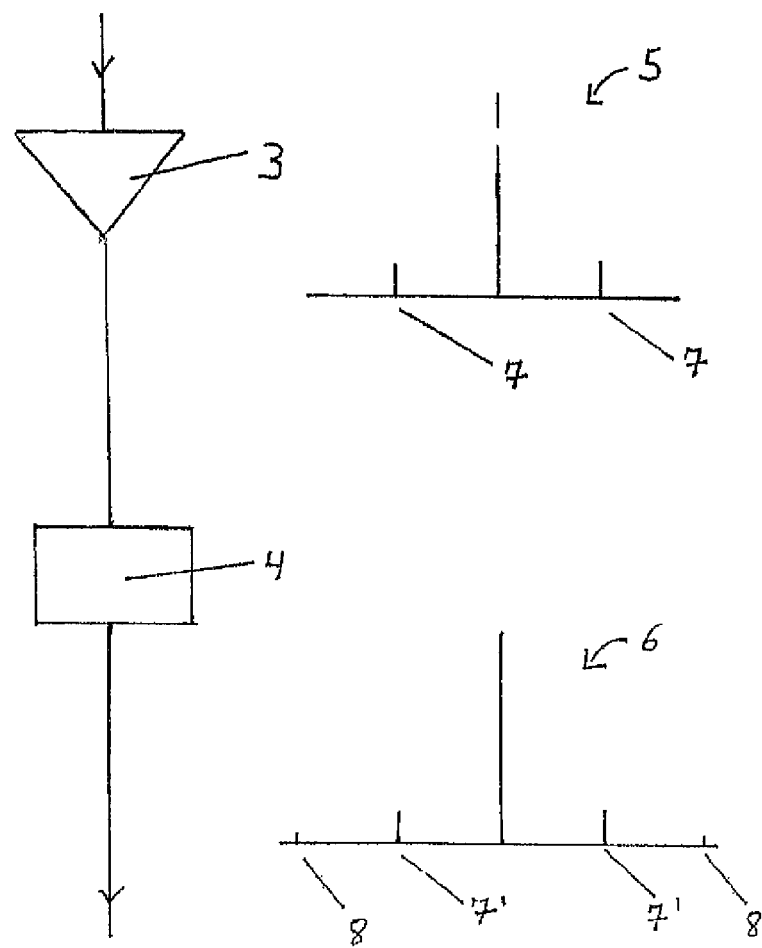

Practical examples of the invention are elucidated in the following by way of drawings, where:

FIG. 1: shows the inventive laser system as a block-type diagram;

FIG. 2: illustrates the modulation scheme according to the present invention.

The laser system shown in FIG. 1 is comprised of a laser light source 1 which is a diode laser. The laser light source 1 is connected to a modulation facility 2 which modulates the injection stream of the (not shown) laser diode of the laser light source 1 in high frequency. Modulation is accomplished simultaneously with two frequencies. One modulation frequency amounts to 1.7 GHz. By way of this modulation frequency, the spectrum of the radiation emitted from the laser light source 1 receives a sideband which ultimately represents the basis for the generation of radiation with the back-pumping frequency according to the hyperfine splitting of the sodium-D-line. The other modulation frequency ranges between 5 and 100 MHz. By way of this modulation, a sideband is generated in the spectrum of the radiation emitted from the laser light source 1, said sideband serving for frequency stabilizing in conformity with the Pound-Drever-Hall process. The spectrum of the radiation emitted from the laser light source 1 has a component with a carrier frequency of 1178 nm. The frequency distance from the carrier frequency to the sidebands amounts to 1.7 GHz and/or 5 to 100 MHz according to the modulation frequencies (for frequency stabilizing).

The modulated radiation from laser light source 1 is passed on to a Raman fibre amplifier 3. The (not shown) amplifier fibre of the fibre amplifier 3 is optically pumped by means of (not shown) laser diodes. The Raman fibre amplifier 3 amplifies the radiation from laser light source 1 with the carrier frequency and with the frequencies of the sidebands. The amplification bandwidth of the Raman fibre amplifier is accordingly wide. At the output of the Raman fibre amplifier 3, the power of the laser radiation amounts to approx. 30 to 40 W in total.

The laser radiation thus amplified is passed on to a resonant frequency multiplier 4. It is a non-linear crystal located within an optical resonator. The optical resonator is frequency-stabilized according to the Pound-Drever-Hall process. The resonant frequency multiplier 4 converts the amplified radiation by frequency multiplication and/or summation-frequency generating. The spectrum of the radiation at the output of the frequency multiplier 4 encompasses intensities with a fluorescence frequency and a back-pumping frequency, wherein the fluorescence frequency is congruent with the sodium-D-line and wherein the frequency distance of the back-pumping frequency from the fluorescence frequency is congruent with the hyperfine splitting of the relevant sodium-D-line. The power of the radiation at the output of the frequency multiplier 4 may range clearly above 20 W, which is advantageous, for example for generating a laser guide star for astronomic telescopes with adaptive optics.

FIG. 2 shows the spectrum 5 of radiation after amplification by means of a Raman fibre amplifier 3. The spectrum evidences an intensive central line with the carrier frequency and a lower as well as an upper sideband 7 with a low intensity. The frequency distance between the sidebands and the central carrier frequency, as has been outlined hereinabove, amounts to 1.7 GHz according to the modulation frequency. The sidebands at +−5 to 100 MHz serving for frequency stabilization are not shown in FIG. 2. Spectrum 5 illustrates that the sidebands 7 generated by modulation are amplified by the Raman fibre amplifier 3 like the central line with the carrier frequency. The carrier frequency corresponds to a wavelength of 1178 nm.

Spectrum 6 results after frequency multiplication and/or summation-frequency generating by means of frequency multiplier 4. To be seen here again is a central line at the fluorescence frequency of 589 nm. This central line is created by frequency doubling of the carrier frequency. Furthermore, spectrum 6 shows the sidebands 7 which are located at a distance of +−1.7 GHz from the fluorescence frequency. These sidebands develop by summation-frequency generating from the components shown in spectrum 5, i.e. at the carrier frequency and at the frequencies of sidebands 7. Moreover, one can see the sidebands 8 which are created by frequency doubling from the sidebands designated with number 7 in spectrum 5. Sidebands 8 are strongly attenuated. Sidebands 7 in spectrum 6 are evident at back-pumping frequency. To obtain a high fluorescence yield, the intensity at back-pumping frequency 7' should at least amount to 10% of the intensity at fluorescence frequency. To reach this target, the summation-frequency generating according to the present invention is applied. This takes advantage of the fact that the resultant intensity in summation-frequency generating behaves like the products of intensities of fundamental light fields.

The invention claimed is:

1. A laser system comprised of
a laser light source which emits electromagnetic radiation,
at least one optical amplifier which amplifies the radiation emitted from the laser light source, and
a frequency multiplier which converts the amplified radiation by resonant frequency-doubling and sum-frequency generation, and
a modulation facility which causes a modulation of the electromagnetic radiation emitted from the laser light source in such a manner that the spectrum encompasses a carrier frequency and at least one sideband,
wherein the frequency multiplier is resonant at the carrier frequency and at the frequency of the at least one sideband.

2. The laser system according to claim 1, wherein the optical amplifier is a Raman fiber amplifier (RFA).

3. The laser system according to claim 1, wherein the spectrum of the radiation converted via the frequency multiplier encompasses a fluorescence frequency and a back-pumping frequency, wherein
the fluorescence frequency corresponds to a resonant optical transition in an atom, i.e. a line in the electronic excitation spectrum of the atom, and
the frequency distance of the back-pumping frequency of the fluorescence frequency corresponds with the hyperfine splitting of the optical transition.

4. The laser system according to claim 3, wherein the fluorescence frequency corresponds to the wavelength of the sodium line at 589 nm and the frequency distance of the back-pumping frequency of the fluorescence frequency amounts to +/−1.7 GHz.

5. The laser system according to claim 3, wherein the modulation frequency, i.e. the frequency distance of the sideband from the carrier frequency in the spectrum of the radiation emitted from the laser light source corresponds to the hyperfine splitting of the optical transition.

6. The laser system according to claim 1, wherein the laser light source is a diode laser with at least one laser diode, with the modulation facility modulating the injection stream of the laser diode in high frequency.

7. The laser system according to claim 1, comprising a stabilization facility which stabilizes the frequency multiplier in frequency, the said modulation facility causing an additional modulation of the electromagnetic radiation emitted from the laser light source in such a manner that the spectrum encompasses at least another sideband for frequency stabilization on the basis of a Pound-Drever-Hall process.

8. Use of a laser system according to claim 1 to generate a laser guide star for astronomic telescopes with adaptive optics.

9. A method for generating a laser guide star for astronomic telescopes with adaptive optics, wherein electromagnetic radiation from a laser light source is amplified via an optical amplifier and wherein the amplified radiation is converted by resonant frequency-doubling and sum-frequency generation,
wherein the spectrum of the electromagnetic radiation from the laser light source by modulation encompasses a carrier frequency and at least one sideband, with the frequency multiplier being resonant at the carrier frequency and at the frequency of the at least one sideband so that the spectrum of the converted radiation encompasses the fluorescence frequency and a back-pumping frequency, wherein the fluorescence frequency corresponds to a resonant optical transition in an atom, i.e. a line in the electronic excitation spectrum of the atom, and the frequency distance of the back-pumping frequency from the fluorescence frequency corresponds to the hyperfine splitting of the optical transition.

10. The method according to claim 9, wherein the radiation converted by frequency-doubling and sum-frequency generation is emitted into the sky without subsequent modulation.

\* \* \* \* \*